United States Patent
Broderick et al.

(10) Patent No.: US 9,720,797 B2
(45) Date of Patent: Aug. 1, 2017

(54) FLASH MEMORY CONTROLLER, DATA PROCESSING SYSTEM WITH FLASH MEMORY CONTROLLER AND METHOD OF OPERATING A FLASH MEMORY CONTROLLER

(71) Applicant: FREESCALE SEMICONDUCTOR, INC., Austin, TX (US)

(72) Inventors: Damon Peter Broderick, Munich (DE); Dirk Heisswolf, Munich (DE); Andreas Ralph Pachl, Neubiberg (DE)

(73) Assignee: NXP USA, Inc., Austin, TX (US)

( * ) Notice: Subject to any disclaimer, the term of this patent is extended or adjusted under 35 U.S.C. 154(b) by 164 days.

(21) Appl. No.: 14/755,010

(22) Filed: Jun. 30, 2015

(65) Prior Publication Data
US 2017/0004063 A1 Jan. 5, 2017

(51) Int. Cl.
| | | |
|---|---|---|
| *G06F 11/00* | (2006.01) | |
| *G06F 11/34* | (2006.01) | |
| *G06F 11/30* | (2006.01) | |
| *G01R 31/319* | (2006.01) | |
| *G01R 31/317* | (2006.01) | |

(52) U.S. Cl.
CPC ........ *G06F 11/3495* (2013.01); *G01R 31/319* (2013.01); *G01R 31/31705* (2013.01); *G06F 11/3037* (2013.01)

(58) Field of Classification Search
CPC ...... G01R 31/319–31/31915; G01R 31/31705; G06F 11/22–11/2242; G06F 11/3466; G06F 11/3495; G06F 11/3037; G06F 11/3041
See application file for complete search history.

(56) References Cited

U.S. PATENT DOCUMENTS

| | | | | |
|---|---|---|---|---|
| 7,533,302 | B2 * | 5/2009 | Wu ..................... | G06F 11/2236 712/227 |
| 8,996,934 | B2 * | 3/2015 | Mozak ................. | G11C 29/56 365/201 |
| 2004/0054815 | A1 | 3/2004 | Carlton Broberg, III | |

OTHER PUBLICATIONS

"MC9S12ZVM—Family" Reference Manual, Freescale Inc., Rev. 1.5, Sep. 22, 2014, Chpater 6, pp. 181-231.

* cited by examiner

*Primary Examiner* — Michael Maskulinski (57) ABSTRACT

The present application relates to a flash memory controller and a method of operating thereof. A system bus interface is provided to interface with a system bus and a debug bus interface is provided to interface with a debug bus. A flash access control block is provided to perform storage I/O operations on a flash memory array. A debug control block is provided to monitor debug related information. The flash memory controller is configured to selectively operate in one or storage operating mode or debug operating mode. In the debug operating mode: the storage control block is configured to serve only read data access requests; and the debug control block is configured to store trace messages in an allocated part of the storage resources of the flash memory controller in response to trace events. The trace messages are generated on the basis of the monitored debug related information.

20 Claims, 4 Drawing Sheets

FLASH MEMORY CONTROLLER, DATA PROCESSING SYSTEM WITH FLASH MEMORY CONTROLLER AND METHOD OF OPERATING A FLASH MEMORY CONTROLLER

FIELD OF THE INVENTION

The present invention relates in general to a data processing system, and more particularly to an apparatus for performing a debug function in a data processing system.

BACKGROUND

When a data processing system fails to operate as intended, various analysis techniques may be used to identify a source of the failure. Generally, trace functions and breakpoint functions are implemented within the data processing system to aid in the isolation of failing circuitry and to facilitate the correction of failing software programs.

Trace functions provide a means for allowing an external user to observe intermediate results of execution of a data processing operation. Trace functions generally provide a status of selected (CPU) registers and memory included in the data processing system after each instruction or a predetermined group of instructions of a software program is executed by the data processing system. By analyzing the status of selected registers and memory, the trace function provides the external user with very detailed information about an internal data flow of a processor (e.g. CPU) or processing system (e.g. embedded processing system). With this information, many types of errors may be identified and subsequently corrected. Breakpoint functions also provide a method for observing erroneous software code or faulty circuits in a data processing system. A breakpoint function is, in effect, where a preselected event occurs causing a break in a software program. Data is then retrievable to determine a status of the software program. The breakpoint function allows the external user to ascertain a status of each of the selected registers and memory such that data processing errors may be identified.

Both the trace function and the breakpoint function have been integrated in currently available microprocessors of data processing systems to provide the previously described isolation and identification capabilities. For instance, a microprocessor is provided with internal breakpoint registers, which can trigger tracing. Such internal breakpoint registers are dedicated to triggering on either instruction execution addresses or on the addresses of various types of data accesses.

A non-intrusive approach for debug control is the implementation of one or more debug circuitries in the data processing system and microprocessor thereof, respectively, to allow for both real time trace and real time debug functions. The implementation of one or more dedicated debug circuitries may not be economically viable for cost sensitive microcontrollers and may not be feasible for microcontrollers with constraints to the dimensions.

Therefore, a need exists for a data processor, which provides trace and debug functionality making use of existing resources to allow for offering cost sensitive microcontrollers and/or dimensions limited microcontrollers with such functionality.

SUMMARY

The present invention provides a data processor, a system-on-chip and a method of operating thereof and as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

DETAILED DESCRIPTION

Embodiments of the present disclosure will be described below in detail with reference to drawings. Note that the same reference numerals are used to represent identical or equivalent elements in figures, and the description thereof will not be repeated. The embodiments set forth below represent the necessary information to enable those skilled in the art to practice the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

In the following description, the term bus will be used to refer to a plurality of signals and/or conductors, which may be used to transfer one or more various types of information such as data, address, control and status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

In the field of embedded systems, the use of System-on-Chip or System-in-Package is state of the art. A System-on-Chip (SoC) is a highly integrated data processing system, which comprises one or more processor cores and further components on a single chip to operate the SoC as a stand-alone data processing system capable of executing program code and communicating and exchanging data with external peripherals, components and/or units. A System-in- Package (SiP) is an alternative highly integrated data processing system, which comprises one or more processor cores and further components in a single package to operate the SiP as a stand-alone data processing system. Accordingly, a SoC or a SiP comprises for instance memories including RAM, ROM, EEPROM and flash memory, clock sources, timers, interfaces to communicate data with external devices, analog signal generators and samplers, voltage regulators and power management circuits. Those skilled in the art understand that the aforementioned enumeration is merely exemplary for the sake of explanation. In the following, the description will refer to a SoC for the sake of explanation only.

In particular in the field of embedded systems, SoC (or SiP) are preloaded with software to be carried out in use. For instance, when using such a SoC based embedded system in monitoring and control applications, the software carried out thereon is typically stored in a non-volatile Flash memory, which is operated as non-volatile mass storage. The software stored in the non-volatile Flash memory comprises e.g. instructions and instruction parameters, which are persistent with regard to an initial state. Any parameters varying at run-time are stored in a volatile memory and are typically discarded when the SoC based embedded system is unpowered or destructively reset into initial state. In such application cases, write access to the non-volatile Flash memory may be only required during (re-)configuration of the embedded system. During run-time the access to the non-volatile Flash memory is substantially limited to read accesses.

In the following, those skilled in the art will appreciate from the description that in use cases like that outlined above vacant resources are available, use of which can be made for enabling debug functionality in particular in cost sensitive microcontrollers and/or dimensions limited microcontrollers. Moreover, the redundant resources may be made use of to enable non-intrusive debug functionality. More particularly, the debug functionality comprises a real-time trace functionality, which is preferably non-intrusive.

In an example of the present application, a flash memory controller with debug functionality is provided. The flash memory controller with debug functionality is operable in a data processing system, which is adapted to provide internal signals thereof to the flash memory controller with debug functionality. The flash memory controller with debug functionality is configured to perform the debug functionality base on the internal signals and to control the data processing system in response to the internal signals to perform debug operations, performance monitoring and/or diagnostic monitoring. In an example of the present application, the flash memory controller with debug functionality is located on-chip such that is capable of accessing a variety of internal signals of various on-chip components of the data processing system. For instance, the flash memory controller with debug functionality may be coupled to receive information from an on-chip processor core, a memory management unit (MMU), a direct memory access unit (DMA) and/or bus monitoring unit.

Figure 1:
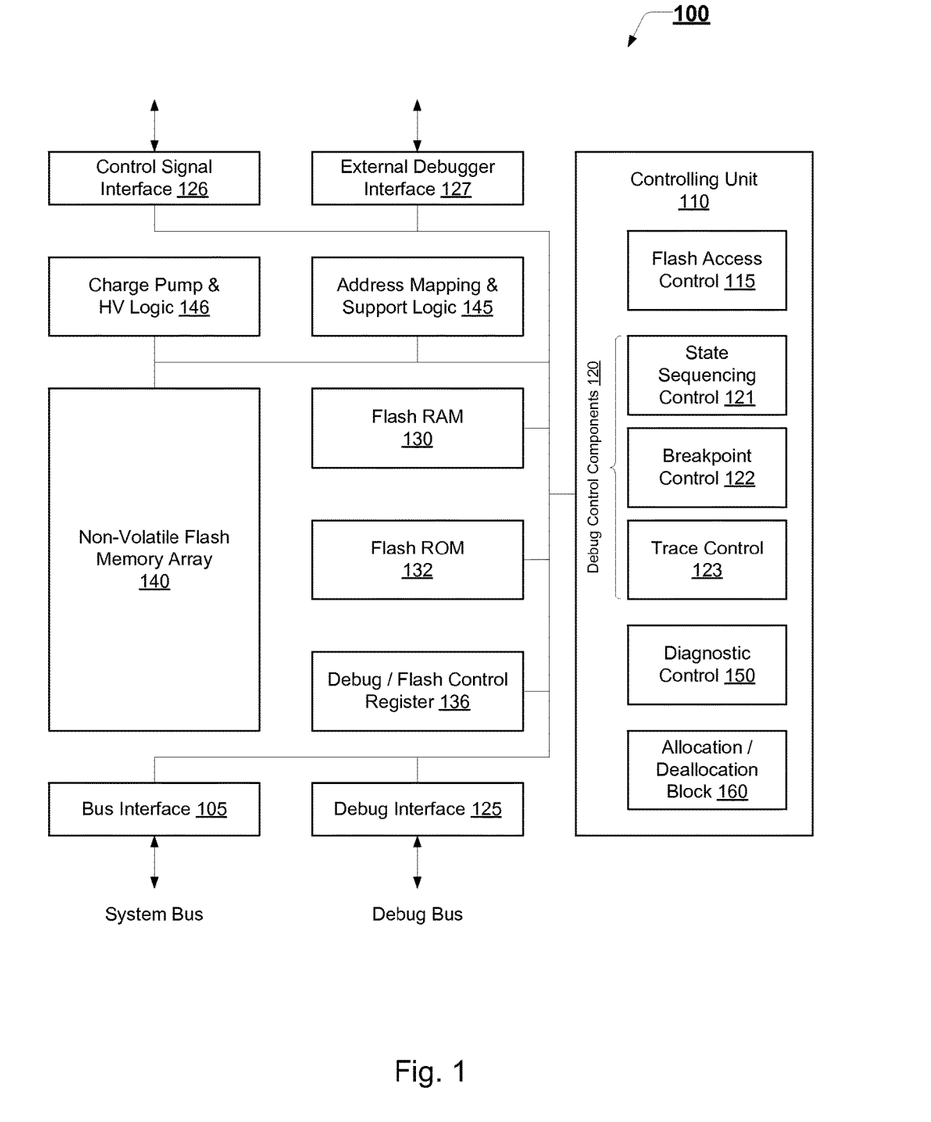
FIG. 1 schematically illustrates a block diagram of an integrated peripheral flash memory controller according to an example of the present invention.

Referring now to FIG. 1, a block diagram of a flash memory controller 100 for operating a non-volatile flash memory array storage according to an example of the present invention is schematically illustrated. It should be noted that the flash memory controller 100 shown in FIG. 1 has been simplified to focus on features of the memory that are helpful in understanding the present invention.

The exemplified flash memory controller 100 is arranged to serve random data accesses including read and or write data accesses received at the bus interface 105 to the flash memory array 140 to read data stored thereat and/or store data thereat. Typically, the flash memory array 140 is formed from a number of individual storage elements, each of which consists of a memory cell that includes a transistor and a charge storage area. The presence or absence of an electronic charge in the charge storage area of a cell can be used to store a logical value "0" or a logical value "1" in the cell for the sake of explanation.

The flash memory array 140 is in small units addressable and readable such as in units of bit, byte, word and longword. However, when storing data at one or more memory locations in the flash memory array 140, the technical nature of flash memory storages and the organization of the flash memory array 140 has to be considered. Whereas the flash memory array 140 is also in small units programmable, each addressed bit can be only programmed from logical value 1 to logical value 0 individually but not from logical value 0 to logical value 1. In order to reset a bit to logical value 1, the respective memory cell has to be erased. The flash memory array 140 is partitioned into blocks, which are memory areas of predefined size. Each block comprises a multiplicity of the addressable small units. An erase operation is only applicable on an entire block. Thus, anytime data in a given memory cell within a given block is to be erased, data in all other memory cells within that block has to be erased also. Hence, overwriting outdated data stored in memory cells of the flash memory array 140 by new data (rewriting) requires an erasing of the block, in which the memory cells are located, to reset the memory cells of the block to the logical value 1 and a re-programming of the memory cells of the block with new data and previously stored data to be maintained.

Accordingly, if data is to be stored at a memory location (of the flash memory array 140), which has not been programmed before, the data is programmed using the ability for addressing and programming in small units. If the data is to be stored at a memory location (of the flash memory array 140), which is programmed before, the data of a block is buffered in a random access memory (RAM) 130, the data to be stored is used to overwrite the outdated data of the buffered data in the RAM 130 and after having erased the respective block, the block is programmed in accordance with the modified data buffered in the RAM 130.

In order to allow for random read and/or write access functionality, the implementation of the flash memory controller 100 is based on a controlling unit 110 and further components comprising registers 136, memory mapping and support logic 145, a charge pump and HV logic 146, a ROM 132 and a RAM 130. Upon reception of access requests via the system bus interface 105 e.g. from a processor core, the controlling unit 110 controls the operation of the flash memory controller 100 in response to and in accordance with the received requests.

As illustratively depicted in the functional block diagram shown in FIG. 1, the exemplary flash memory controller 100 has a system bus interface 105, though which it is coupled to a system bus, through which the components of the data processing system communicate data e.g. one or more processor cores thereof. The flash memory controller 100 and the processor cores form part of the data processing system.

The flash memory controller 100 includes the array of flash memory cells 140 or some other type of non-volatile memory cells. The flash memory array 140 may be arranged in banks of rows and columns. The control gates of each row of memory cells is coupled with a word line while the drain and source connections of the memory cells are coupled to bit lines. As is well known in the art, the connection of the cells to the bit lines depends on whether the array is a NAND architecture, a NOR architecture, an AND architecture, or some other array architecture.

Flash control registers 136 and an address mapping logic 145 is provided to latch address information provided in access requests received through the system bus interface 105. The address information is received and decoded by the address mapping logic 145 to access the memory array 140. The flash memory controller 100 reads data in the flash memory array 140 by sensing voltage or current changes in the memory array columns using the support logic 145. For instance, the support logic 145, in one example, is coupled to read and latch a row of data from the flash memory array 140. A data input and output buffer such as the flash RAM 130 is included for supporting bi-directional data communication through the system bus interface 105 with the data processing system. A charge pump and high-voltage logic 146 is provided to generate a voltage signal for programming and/or erasing one or more memory cells of the flash memory array 140.

The storage operation of the exemplified flash memory controller 100 is under control of a controlling unit 110. The controlling unit 110 decodes access requests provided through the system bus interface 105 interfacing with the system bus of the data processing system. The access requests determine the operations on the flash memory array 140, including data read, data program, and erase operations as briefly explained above. The controlling unit 110 may be a configurable state machine, a sequencer, or some other type of controller. In particular, the controlling unit 110 may be a programmable microcontroller unit. The controlling unit 110 according to an example of the present invention is responsible for operating and controlling the components of the flash memory controller 100. In particular, the configurable controlling unit 110 may comprise several control blocks comprising instructions to be carried out by the configurable controlling unit 110. The control blocks may be provided in the read only memory (ROM) 132. The ROM 132 may be a reconfigurable read only memory such as an EEPROM (electrically erasable programmable read-only memory). The control blocks may comprise a flash I/O control block 115 comprising instructions carried out by the configurable controlling unit 110 in response to a reception of a read data request, write data request or a control request relating to one or more operations to be carried out on the flash memory array 140 and the data stored thereat. In particular, the flash I/O control block 115 is responsible for operating and controlling the components of the flash memory controller 100 to allow for random access storage functionality.

As those skilled in the art understand from the above description, the data read requests may be served based on the data stored in the flash memory array 140 and in particular the address mapping and support logic 145 without requiring operations to be carried out at the controlling unit 110. The flash I/O control block 115 carried out at the configurable controlling unit 110 is in particular provided to perform operations for programming and/or erasing flash memory cells. For instance, the flash I/O control block 115 is arranged to perform a programming algorithm defined as an iterative program and margin read sequence. Every program operation is followed by a margin read until the data is programmed successfully. Such a margin read step of the smart programming algorithm is used to ensure programmed bits are programmed to sufficient margin for data retention over the device's lifetime.

The flash memory controller 100 according to an example of the present application comprises further components 120 relating to debug controlling and tracing functionalities such as a state sequencing control block 121, a breakpoint/watchpoint control block 122 and/or a trace control block 123. The operation of the debug control components 120 integrated in the flash memory controller 100 will be fully understood on the basis of the following description relating to FIGS. 2 and 3, with respect to which different operating states and functionalities associated therewith of the flash memory controller 100 will be described.

From the above description those skilled in the art understand that the flash memory controller 100 schematically illustrated in FIG. 1 has been simplified to facilitate a basic understanding of the features of the memory and is for purposes of illustration only. In particular, although the flash memory controller 100 of FIG. 1 comprises the flash memory array 140, those skilled in the art appreciate that the flash memory array 140 may be considered as a separate component. The flash memory controller 100 interfaces between the system bus and the flash memory array 140 representing the physical storage. A more detailed understanding of internal circuitry and functions of flash memories are known to those skilled in the art. Alternate embodiments may include the flash memory cell of the present invention in other types of electronic systems.

Figure 2:
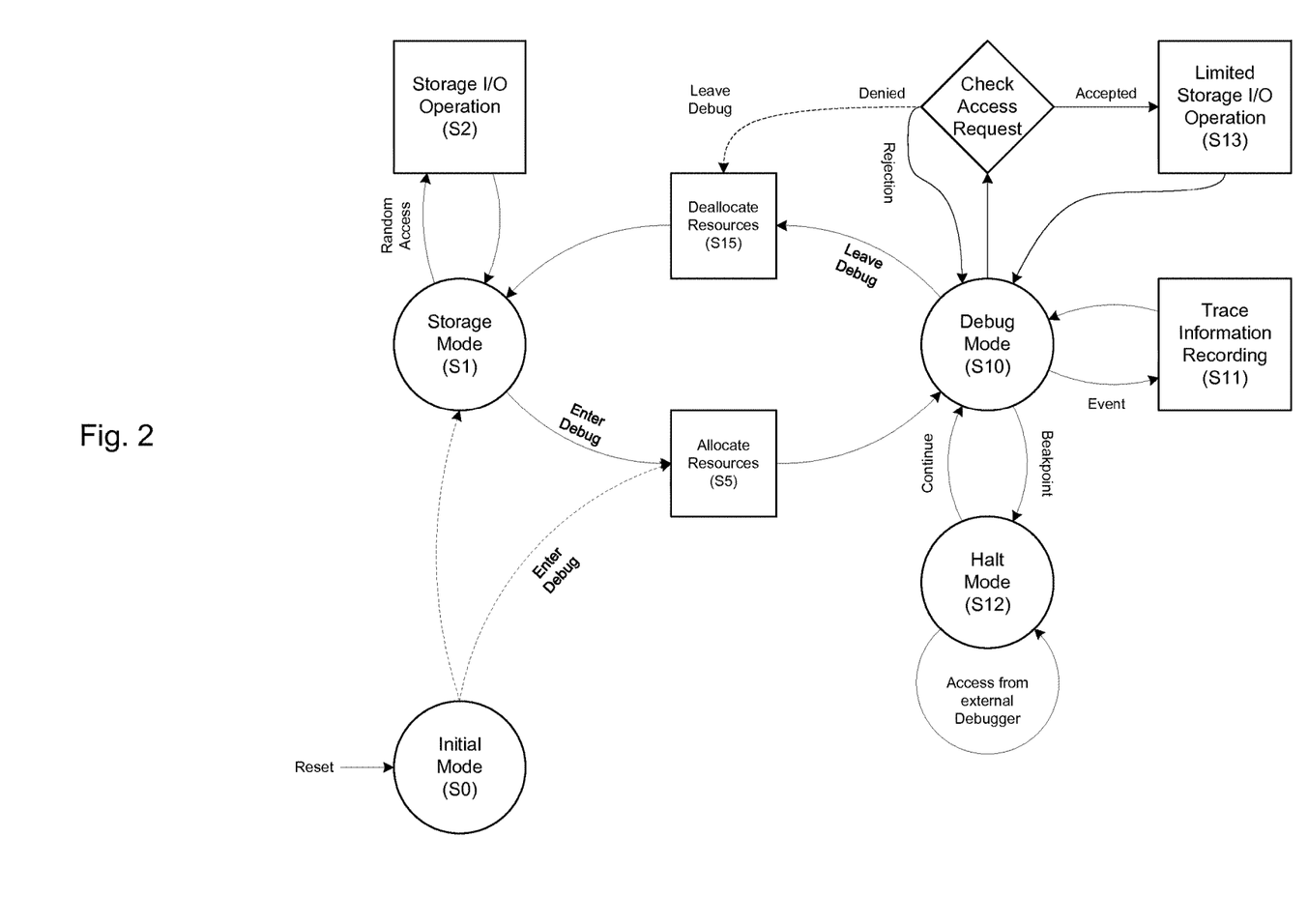
FIG. 2 shows a state diagram schematically illustrating the operation of a flash memory controller according to an example of the present invention.

Referring now to FIG. 2, the operational modes of the flash memory controller 100 with debug functionality will be described in detail. For the sake of a more complete understanding, references back to the schematic block diagram illustrated in FIG. 1 will be made.

Upon powering or reset the flash memory controller 100 may enter an initial operating mode S0, starting from which the flash memory controller 100 may enter one of a storage operating mode S1 or a debug operating mode S10.

In the storage operating mode S1, the flash memory controller is configured to accept random data access requests received via the system bus interface 105 and serve the random data access requests accordingly. In particular, on receiving a random data access request, which may comprise a data read access request, a data write access request and/or an erase access request, the flash memory controller 100 performs a storage I/O operation S2, in which the flash controller 100 is configured to process in accordance with the received data access request.

For instance, in case the random data access request is a data read access request (received through the system bus interface 105) instructing the flash memory controller 100 to transmit back a request response containing data of one or more memory locations addressed in the read request, the controlling unit 110 and the flash control block 115 thereof retrieve the requested data from respective memory cells of the flash memory array 140. The respective memory cells are identified by the address mapping logic 145 on the basis of the memory locations indicated in the data read access request. A data read access request response is generated, which comprises the retrieved data from the flash memory array 140, and is transmitted back to the requestor of the data.

In case the random data access request is a data write access request (received through the system bus interface 105) instructing the flash memory controller 100 to write data comprised in the data write access request to one or more memory locations indicated in the write access request, the controlling unit 110 and the flash control block 115 thereof program respective memory cells of the flash memory array 140 in accordance with the data comprised in the data write access request. The respective memory cells are identified by the address mapping logic 145 on the basis of the memory locations indicated in the write access request. The flash memory controller 100 serving a data write access request may make use of the flash RAM 130 for data buffing.

After completion of the storage I/O operation S2, the flash memory controller 100 serves or waits for a next data access request to be served.

According to an example of the present application, the flash memory controller 100 is also selectively operable in the debug operating mode S10. The flash memory controller 100 may receive a control instruction to transition from storage operating mode S1 to debug operating mode S10 or the flash memory controller 100 may transition from initial mode S0 to debug operating mode S10; e.g. a control register of the flash memory controller 100 comprises a register content, which controls the flash memory controller 100 to transition into debug operating mode S10. The flash memory controller 100 may receive a control instruction in case the data processing system is instructed to operate in a debug mode.

In response to a controlling of the flash memory controller 100 to transition to the debug operating mode S10, at least a part of resources available in the flash memory controller is allocated for registering and storing debugging related information in an intermediate allocation operation S5 by an allocation/deallocation block 160 of the flash memory controller 100. The resources available for allocating comprises at least a part of the flash RAM 130. The allocation/deallocation block 160 may be further configured to perform re-configuration operations such as a re-configuration of one or more registers for use by the debug control components 120, which will be more fully described below. Those skilled in the art will understand that the resources available for allocation also comprises resources, which are included for production and/or test purpose of the flash memory controller 100. In the intermediate allocation operation S5, any pending I/O storage operations may be completed and/or terminated.

In debug operating mode S10, one or more of the debug control components 120 are active, which are inactive when the flash memory controller 100 is in storage operating mode S1. As illustratively shown in FIG. 1, the flash memory controller may comprise a trace control block 123, a breakpoint control block 122 and/or a sequence control block 121 enabling the debug functionality of the flash memory controller 100. From the following description those skilled in the art will understand that the debug control components 120 are configured to leverage components and resources of the flash memory controller 100 originally provided to be used for storage I/O operations.

According to an example of the present invention, the storage I/O operation of the flash memory controller 110 is limited when operating in debug operating mode S10 due to the allocation of a part of the resources and due to the use of the allocated resources of the flash memory controller 100 for debug functionality. The storage I/O operation of the flash memory controller 100 may be limited to reading data from the flash memory array 140 upon receiving a data read access request and/or data write access requests addressing previously erased memory locations, which are not already programmed. As aforementioned, programming or re-programming data at memory locations in the flash memory array 140 requires data buffer capacity e.g. for temporary buffering data of a block to be erased. After allocation of at least a part of the resources for debug functionality a sufficient capacity for buffering the data of a block of the flash memory array 140 may be unavailable. Hence, the storage I/O operation of the flash memory controller 100 is limited to a read only memory (ROM), when the flash memory controller 100 is operating in debug operating mode S10.

In an example of the present application, the unallocated part of the resources may be used to enable the operation of the flash control block 115 with limited storage I/O operation in the configurable controlling unit 110. In an example of the present invention, data read from the flash memory array 140 may be directly passed to the system bus interface 105.

In an example of the present application, on receiving a data access request, it is first determined whether the received data access request can be served by the flash memory controller 100 operating in debug operating mode S10 with limited I/O storage operation capability. In case the received data access request is servable, the flash memory controller performs the requested data access. Otherwise the received data access request is rejected or delayed in the debug operating mode S10. The served I/O storage operations are non-intrusive with respect to the debug functionality of the flash memory controller 100 operating in debug operating mode S10.

For instance, on receiving a data read access request, the flash controller 100 is configured to operate in accordance with the received read access request. The requested data is read from the flash memory array 140 and a request response is communicated through the system bus interface 105 to the requestor.

The flash controller 100 is configured to ensure that data read access request are performed non-intrusively. In particular, the flash controller 100 may be configured that any data read access requests are servable without delays.

For instance, on receiving a data write access request, the flash memory controller 100 determines whether the requested write access request can be served in the debug operating mode S10. The flash memory controller 100 is arranged to reject or delay the received data write access request In an example of the present application, the flash memory controller 100 may be arranged to accept data write access requests to previously erased memory cells of the flash memory array 140 provided sufficient resources are available for the executing the programming operation of the previously erased memory cells. Delayed data access requests may be served by the flash memory controller 100 once the flash memory controller 100 operates in storage operating mode S1.

On detecting a servable data write access request, the flash memory controller 100 performs the storage I/O operation S13, in which the flash controller 100 is configured to process in accordance with the received write access request. The memory cells of the flash memory array 140 are programmed based on the data comprised in the data write access request.

In an example of the present application, the debug functionality of the flash memory controller 100 in debug operating mode supports trace functionality. Trace functionality allows for instance a user such as an external debugger, to observe and reconstruct internal operations of the data processing system. An external debugger may connect to the flash memory controller 100 through a debug bus interface 125 or a dedicated debugger interface 127. The supported trace functionality comprises particularly real time trace functionality and more particularly, non-intrusive trace functionality. The internal operations of data processing system may be dynamically observed. The observation may be performed substantially without impacting the operation of the data processing system.

As already described above, on controlling the flash memory controller 100 to transition to the debug operating mode S10, at least a part of the resources of the flash memory controller 100 is allocated (cf. operation S5) for debug functionality. In particular, the allocated part of the resources is provided to register and store debug related information. Debug related information in particular comprises for instance program trace information relating to a flow of a program executed on one or more of the processor cores, data trace information relating to changes of data stored at one or more specified address ranges and/or status information relating to internal status of one or more components of the data processing system.

The program trace information may comprise information relating program flow discontinuities (information about direct and indirect branches, exceptions etc.), which enables an external debugger to interpolate what sequence of events occurred between such discontinuities. More generally, the trace information may comprise data trace information (DTM: data trace messages), ownership trace information relating to e.g. process identifiers or operating system tasks getting activated (OTM: ownership trace messages), program trace information (PTM: program trace messages) and watchpoint trace information (WTM: watchpoint trace messages) generated upon occurrence of programmed watchpoints. Debugging related information may further comprise state information and/or register states of debuggable components including for instance integrated peripherals with debug ability.

The registering of the debugging related information is performed under control of the trace control block 123 carried out by the controlling unit 110 of the flash memory controller 100. The registering of the debugging related information comprises monitoring of debugging related information, collecting the monitored debugging related information, generating trace messages on the basis of at least a part of the collected debugging related information and storing of the generated trace messages. The trace control block 123 is in particular configured to monitor trace related information of the data processing system including e.g. instruction snooping, data snooping, address snooping and status information observing. The monitored trace related information further comprises program counter values, data, opcode and/or vector fetches.

To enable the monitoring of debugging related information, the trace control block 123 is arranged to monitor internal information of debuggable components of the data processing system through a debug interface 125 coupled to a debug bus of the data processing system. For instance, instruction and data snooping and status observing is performed through the debug interface 125 and the debug bus interfacing with an internal bus of the one or more processor cores. In particular, the monitoring access to the internal bus of a processor core allows for capturing address flow changes to trace a program flow. The dynamic execution path of the program executed at a processor core can be determined by additionally observing the status information of the processor core.

The monitoring may not be limited to instruction and data snooping at the internal bus of the processor cores but may further comprise monitoring of internal information of debuggable components such as data, address and/or status information of a direct memory access unit (DMA) and a memory management unit (MMU) being coupled to the flash memory controller 100 via the debug interface 125 to enable access to information only available internally to the debuggable components. The trace control block 123 is configured as a trace buffer manager to manage collecting of trace related information, generating trace messages based on the collected information and/or storing the generated trace messages in the allocated part of the resources.

The trace control block 123 generates trace messages on the basis of trace related information obtained by monitoring. The generation of a trace message may be triggered by a respective trace event. Such a trace event may be generated by the trace control block 123 based on the monitored debug related information, an interrupt or in response to watchpoint. On occurrence of a trace event, the flash memory controller 100 performs a trace information recording operation S11. In the trace information recoding operation S11, the trace control block 123 is configured to generate a trace message on the basis of the monitored and/or collected information and to store the generated trace message in the allocated part of the resources.

The operation of the trace control block 123 may be controlled by one or more registers 136 storing trace related configurations and status. The one or more registers 136 may be configurable. The one or more registers 136 may be separate registers for debug control and/or debug status purpose. The one or more registers 136 may be flash control and status registers of the memory flash controller 100, which are reconfigurable to be used as debug control/status registers 136.

The debug control/status registers 136 are configurable to control the tracing of the debug related information, for instance by an external debug tool, by one or more further debug control components 120, or by debug software executed on one or more processor cores of the data processing system. Further, a state sequencing control block 121 and/or a watchpoint control block 122 of the debug control components 120 may configure the debug control/status registers 136.

The monitored trace related information may be filtered under control of the trace control block 123. One or more registers 136 of the flash memory controller 100 may be used as comparator value registers under the control of the trace control block 123. The registers 136 may be separate registers for storing comparator values or the registers 136 may be flash control and status registers of the memory flash controller 100, which are reconfigurable to be used as comparator value registers 136 when the flash memory controller operates in debug operating mode S10. In particular, the reconfigured registers used as comparator registers are applicable for detecting trace triggers and/or breakpoints as described below in more detail.

The one or more registers 136 may be further used as trace data temporary registers under control of the trace control block 123. Such trace data temporary registers may be applied to collect monitored trace related information. Once the collected information comprises the desired information, a trace message may be generated to be stored in the allocated part of the resources in response to a trace event indicating the presence of the desired information. The trace data temporary registers may be used to temporarily buffer data, which may be received prior to a trace event, such as an address information relating to change-of-flow (COF) before the change of flow occurs.

The operation of the trace control block 123 may be started on a trace trigger event, e.g. based on a watchpoint, in response to which the change-of-flow (COF) and/or vectors are monitored until a further trace trigger event, ending the operation of the trace control block 123. The information gathered during the operation of the trace control block 123 is collected to generate a trace message or trace record therefrom.

The trace control block 123 may comprise a time stamp module, which is arranged to generate a time stamp to be appended to or included in a trace message generated by the trace control block 123.

In an example of the present application, the debug control components 120 of the controlling unit 110 may further feature additional debug functionalities including a breakpoint/watchpoint control block 122.

Breakpoint operations are typically used to stop (break) the execution of code at a particular point in code flow. Thus when a breakpoint is encountered the processing core(s) stop(s) execution. A user may then use an external debugger to analyze the status of system registers and/or memory(ies) and flags at that breakpoint. A breakpoint is typically aligned to (the address of) a particular instruction or memory access, but may also occur in response to a full trace buffer or an interrupt.

In an example of the present application, the breakpoint/watchpoint control block 122 is configured to perform such breakpoint operations. Breakpoint operations may be based on a breakpoint value of the program counter, an address, an address range, and a data value. The breakpoint/watchpoint control block 122 is configurable, e.g. by an external debugger, with one or more breakpoints.

The flash memory controller 100 and the trace control block 123 thereof are enabled to monitor accesses to one or more memory locations and/or one or more ranges of memory locations by one or more processor cores or the further debuggable components, a program counter register of a processor core and data processed at a processor core or the further debuggable components. The monitored address information, program counter value and/or data information is compared with a respective configured breakpoint value. If the comparison results to matching, a breakpoint event is asserted. The flash memory controller 100 may transition to halt mode S12 and the processor cores of the data processing system may be halted in response to a breakpoint event.

Watchpoint operations are typically used during a debugging operation to monitor access to predefined addresses, predefined address ranges and/or data variable addresses. The watchpoint control block 122 is configurable with address information and is configured to compare monitored accesses to addresses with the configured address information. Upon detection of an access to a predefined address by the breakpoint/watchpoint control block 122, a watchpoint event is asserted. The breakpoint/watchpoint control block 122 is further configured to monitor the value at a predefined storage address. The breakpoint/watchpoint control block 122 is adapted to detect a modification of the monitored value or compare the monitored value with a predefined target value configured at the breakpoint watchpoint/control block 122. In case of a detection, a watchpoint event is asserted. A trace trigger may be generated in response to an asserted watchpoint event.

The breakpoint/watchpoint control block 122 may make use of one or more registers 136 of the flash memory controller 100 as comparator value registers to store one or more address, program counter and/or data target values for being compared with monitored address, data and/or status information under the control of the breakpoint/watchpoint control block 122.

In a further example of the present application, the debug control components 120 of the controlling unit 110 features additional debug functionalities including a state sequencing performed by the state sequencing control block 121.

The state sequencing control block 121 executed at the configurable controlling unit 110 may be provided to control the operation of the trace control block 123 in response to multi-level sequences of branching conditions and conditional states associated therewith. The state sequencing control block 121 is configured to receive one or more of trigger signals, interrupt signals, status information relating to the status of components of the data processing system, access indications to special purpose registers, timer signals, counter signals, exception vector signals and the like. The state sequencing control block 121 may receive one or more signals output by the trace control block 123 and/or the breakpoint/watchpoint control block 122.

The state sequencing control block 121 comprises configurable condition logic with a number of conditional sequences. A preconfigured selection of signals and/or information are subjected to logical combinations each leading to a conditional state within a multi-level state sequence. The state conditions are interlinked in accordance with branching conditions, which in particular enables to configure complex nested conditional sequences with multi-level states for analyzing/evaluating the predefined selections of signals and/or information. One or more action signals may be generated in response to a conditional state by the state sequencing control block 121. In particular, the state sequencing control block 121 is configured to generate trace events in response to predefined conditional states determined on the basis of signals and information received by the state sequencing control block 121.

In an example of the present invention, the flash memory controller 100 transitions to a halt operating mode S12 e.g. upon receiving a control signal or a breakpoint event holding the one or more processor cores of the data processing system. In the halt operating mode S12, the trace messages stored in the flash RAM 130 are retrievable by an external debugger. The trace control block 123 is for instance configured to receive retrieval requests from the external debugger through the debug interface 125 or a separate external debugger interface 127. Upon reception of a retrieval message, the trace control block 123 retrieves one or more requested trace messages from the flash RAM 130 and transmits the retrieved trace messages to the requesting external debugger.

The flash memory controller 100 transitions back to the debug operating state S10 on receiving a respective control signal.

The flash memory controller 100 may transition to the halt operating mode S12 upon a control signal generated by the state sequencing control block 121 and/or the watchpoint control block 122.

According to an example of the present application, the flash memory controller 100 operating in the debug operating mode S10 may transition to the storage operating mode S1, in which the debug functionality is disabled. The flash memory controller 100 may receive a control instruction to transition from debug operating mode S10 to the storage operating mode S1. Alternatively or additionally, the flash memory controller 100 may transition from debug operating mode S10 to the storage operating mode S1 upon receiving a data access request, which is not servable in the debug operating mode due to the limited storage I/O operation described above.

The flash memory controller 100 transitioning from the debug operating mode S10 to the storage operating mode S1 first execute an intermediate deallocation operation S15. In the intermediate deallocation operation S15 performed by the allocation/deallocation block 160, the allocated part of the resources is deallocated. In an example of the present application, the allocated part of the flash RAM 130 is deallocated and hence may available for storage I/O operation. The deallocating of the allocated part of the resources may include an erasing of the trace messages previously stored thereat. The allocation/deallocation block may be further configured to perform back-configurations of one or more registers previously configured for being used by the debug control components 120. In the intermediate deallocation operation S15, any pending debug related operations may be completed and/or terminated.

The functionality and operating modes of the flash memory controller as exemplified with regard to FIG. 1 has been set forth above with reference to illustrative and schematic state diagram shown in FIG. 2. The illustrated operating states should be understood as explanatory for the sake of understanding of the present application and the underlying concept. The flash memory controller may operate in further operating modes. For instance, the storage I/O operating mode may be subdivided into operating modes specific to the type of I/O operation, e.g. a read operating mode, a program operating mode and/or an erase operating mode.

The control blocks, under the control of which the different functionalities are operated, are described as being part of the configurable controlling unit 110. Those skilled in the art will understand that the control blocks may be implemented on the basis of integrated circuits providing the above described functionalities.

With regard to FIG. 2 above, the storage operating mode and the debug operating mode of the flash memory controller 100 according to an example of the present application have been exemplified. The debug operating mode of the flash memory controller 100 is intended to be used for developing and testing applications run on the data processing system. In purposed operational use of the data processing system carrying out one or more software applications for a specific purpose, the debug functionality is not made use of. In such a case, the unutilized resources of the flash memory controller may be used for registering diagnostic information gathered during application use.

Figure 3:
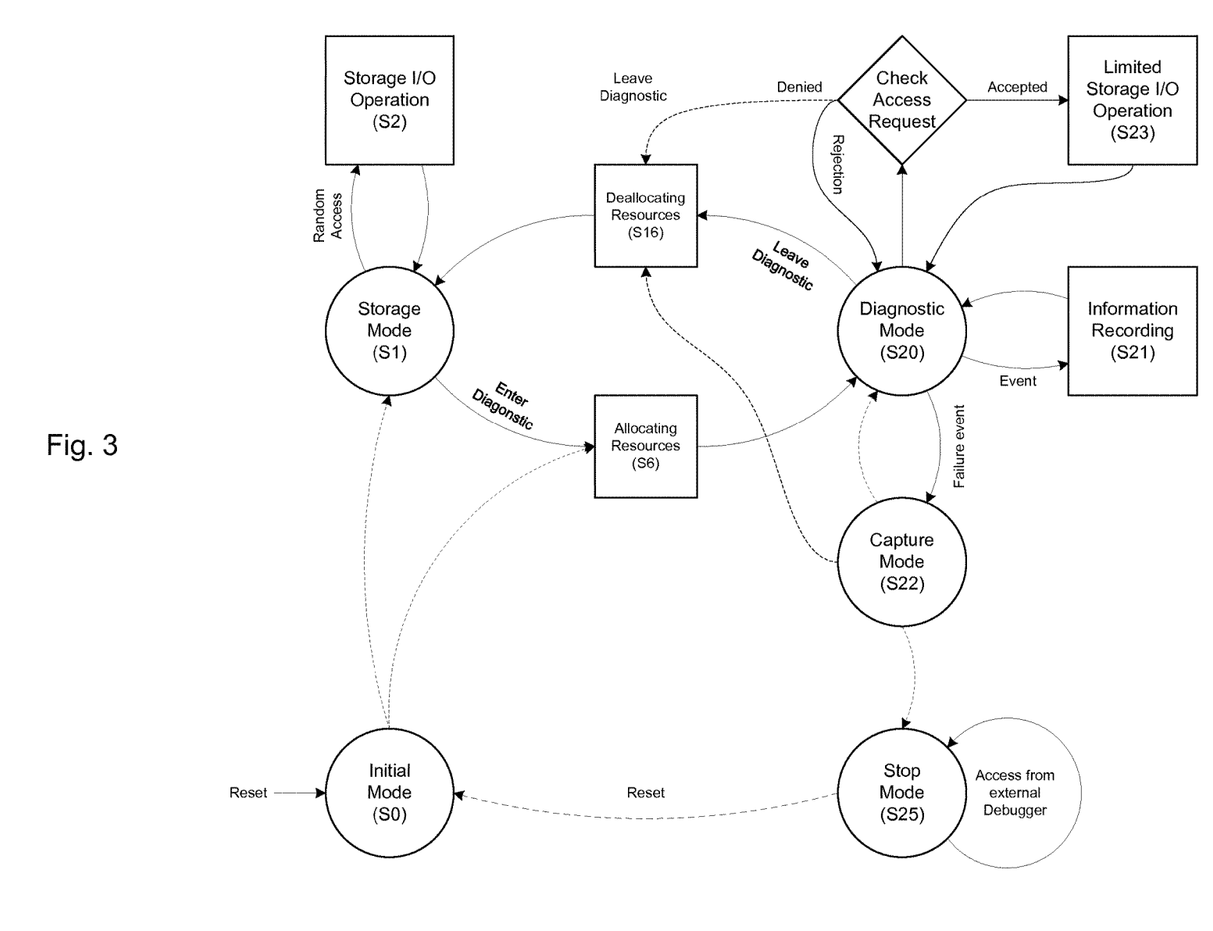
FIG. 3 shows a further state diagram schematically illustrating the operation of a flash memory controller according to an example of the present invention.

Referring now to FIG. 3, a diagnostic operating mode, which should be understood to represent a further operational mode of the flash memory controller 100 with debug functionality, will be described in detail. For the sake of a more complete understanding, references back to the schematic block diagram illustrated in FIG. 1 will be made.

Upon powering or reset the flash memory controller 100 may enter an initial operating mode S0, starting from which the flash memory controller 100 may enter one of a storage operating mode S1 or a diagnostic operating mode S20.

In the storage operating mode S1, the flash memory controller is configured to accept random data access requests received via the system bus interface 105 and serve the random data access requests accordingly. In particular, upon receiving a random data access request, which may comprise a data read access request, a data write access request and/or an erase request, the flash memory controller 100 executes the storage I/O operation S2, in which the flash controller 100 is configured to process in accordance with the received data access request. The storage operating mode S1 is already described with reference to FIG. 2. For the sake of omitting unnecessary repetitions, reference is made thereto.

According to an example of the present application, the flash memory controller 100 is also selectively operable in the diagnostic operating mode S20. The flash memory controller 100 may receive a control instruction to transition from storage operating mode S1 to diagnostic operating mode S20 or the flash memory controller 100 may transition from initial mode S0 to diagnostic operating mode S20; e.g. a control register of the flash memory controller 100 comprises a register content, which controls the flash memory controller 100 to transition into diagnostic operating mode S20.

In response to a controlling of the flash memory controller 100 to transition to the diagnostic operating mode S20, at least a part of the resources of the flash memory controller 100 is allocated for registering diagnostic related information in an intermediate allocation operation S6 operated by the allocation/deallocation block 160. The allocation deallocation block 160 may be further configured to perform re-configuration operations such as a re-configuration of one or more registers for use by the diagnostic control block 150. In the intermediate allocation operation S6, any pending I/O storage operations may be completed and/or terminated.

In diagnostic operating mode S20, a diagnostic control block 150 is active, which is inactive when the flash memory controller 100 is in storage operating mode S1. From the following description those skilled in the art will understand that the diagnostic control component 150 is configured to leverage components and resources of the flash memory controller 100 originally provided to be used for storage I/O operations.

According to an example of the present invention, the storage I/O operation of the flash memory controller 100 is limited when operating in diagnostic operating mode S20 due to the allocation of a part of the resources and due to the use of components of the flash memory controller 100 for debug functionality. The storage I/O operation of the flash memory controller 100 may be limited to reading data from the flash memory array 140 upon receiving a data read access request and/or data write access request addressing previously erased memory locations, which are not already programmed.

Upon receiving a data access request, it is first determined whether the received data access request can be served by the flash memory controller 100 operating in diagnostic operating mode S20 with limited I/O storage operation capability. In case the received data access request is servable, the flash memory controller performs the storage I/O operation S23.

The storage I/O operation S23 substantially corresponds to the storage I/O operation S13 described with reference to FIG. 2. For the sake of omitting unnecessary repetitions, reference is made thereto.

In an example of the present application, the diagnostic functionality of the flash memory controller 100 in diagnostic operating mode S20 supports registering of diagnostic information. The registering of diagnostic information allows for instance a user to reproduce operations of the data processing system during intended application. The supported diagnostic functionality comprises particularly gathering of system and applications related diagnostic data related information in real time trace and more particularly, a non-intrusive gathering of the diagnostic information. In an example of the present application, the observation may be performed without impacting the operation of the data processing system.

In order to collect diagnostic information the debug control components 120 described above with reference to FIG. 2 may be used. The diagnostic information may comprise debugging related information and in particular trace related information monitored, collected and generated with the help of the trace control block 123. In an example of the present application, one or more blocks of the debug control components 120 may be activated and operated as part and/or under control of the diagnostic control block 150.

As already described above, upon controlling the flash memory controller 100 to transition to the diagnostic operating mode S20, at least a part of the resources of the flash memory controller 100 is allocated (cf. S6) for diagnostic functionality. In particular, the allocated part of the resources is provided to store diagnostic information.

Diagnostic information may further comprises for instance performance information. Performance information may be obtained from one or more hardware performance counters, which are registers dedicated to monitoring performance events, such as cache misses and taken branches. Modern architectures usually support a number of performance-counter registers and a relatively large number of performance events. Each register can be configured to monitor any supported performance event at run time. The performance information may be retrieved by the diagnostic control block 150 through the system bus or through the control signal interface 126 from the hardware performance counters.

Diagnostic information comprises information relating to interrupts and/or exceptions. Information relating to interrupts and/or exceptions may be received as control signals through the control signal interface 126.

Diagnostic information may further comprises status information of one or more components of the data processing system available when the data processing system is operated in normal (intended purpose) operation. Such status information may be retrieved by the diagnostic control block 150 through the system bus from respective components.

Diagnostic information may also comprise information generated by one or more applications running on the data processing system. The application generated information may be transmitted to the flash memory controller 100 in a control message request through the system bus.

The registering of the diagnostic information is performed under control of the diagnostic control block 150 carried out by the controlling unit 110 of the flash memory controller 100. The registering of the diagnostic information comprises collecting diagnostic information, generating diagnostic messages on the basis of at least a part of the collected diagnostic information and storing of the generated diagnostic messages. The generated diagnostic messages are stored in the allocated resources.

The diagnostic control block 150 may comprise a time stamp module, which is arranged to generate a time stamp to be appended to or included in a diagnostic message generated by the diagnostic control block 150.

In an example of the present application, the flash memory controller 100 is arranged to store the generated diagnostic messages stored in the volatile flash RAM 130 to the flash memory array 140 to ensure that the generated diagnostic messages remain available e.g. in case of a destructive reset and/or powering off. The storing of the generated diagnostic messages in the flash memory array 140 may be initiated by a control message or signal sent to the flash memory controller 100 in case of an error event or a detection of an error event by the flash memory controller 100. Such a control message or signal may be received by the flash memory controller 100 via the control signal interface 126 or the system bus interface 105.

In case of an error event, which e.g. renders the data processing system inoperable (such that a reset of the data processing system may be required to continue operation) or causes the data processing system to operate in a fail-safe operating mode, the flash memory controller 100 transitions to a capture operating mode S22.

In the capture operating mode S22, the diagnostic messages stored in the flash RAM 130 are programmed in the flash memory array 140. The diagnostic control block 150 is arranged to control the flash access control block 115 accordingly. The diagnostic messages are programmed at memory locations, which are not used by application instructions and data. In an example, the flash memory array 140 may comprise a memory region, which is dedicated for storing diagnostic messages in the capture operating mode S22.

After having programmed the diagnostic messages in the flash memory array 140, the flash memory controller 100 may for instance transition back to the diagnostic operating mode S20 or to the storage operating mode S1 in order to allow for continued operation of the data processing device. For instance, the data processing device may continue to operate in a fail-safe mode requiring an operational the flash memory controller 100.

In case the flash memory controller 100 transitions to the storage operating mode S1, the allocated part of the resources is deallocated in an intermediate deallocation operation S16 by the allocation/deallocation block 160. In particular, allocated part of the flash RAM 130 is deallocated such that the flash RAM 130 may be available for storage I/O operation. The deallocating may include an erasing of the diagnostic messages previously stored thereat. The allocation/deallocation block 160 may be further configured to perform back-configuration of the one or more registers configured for being previously used by the diagnostic control block 150. In the intermediate deallocation operation S16, any pending diagnostic related operations may be completed and/or terminated.

Further alternatively, the flash memory controller 100 may transition to the stop operating mode S25 after having programmed the diagnostic messages. In the stop operating mode S25, the programmed diagnostic messages may be retrievable by an external debugger.

The diagnostic control block 150 is for instance configured to receive retrieval requests from the external debugger through the debug interface 125 or a separate external debugger interface 127. Upon reception of a retrieval message, the diagnostic control block 150 retrieves one or more requested diagnostic messages from the flash RAM 130 and/or the flash memory array 140 and transmits the retrieved diagnostic messages to the requesting external debugger.

According to another example of the present application, the flash memory controller 100 operating in the diagnostic operating mode S20 may transition back to the storage operating mode S1, e.g. on receiving a control instruction to transition and/or on receiving a data access request not servable in the diagnostic operating mode S20.

The flash memory controller 100 transitioning from the diagnostic operating mode S20 to the storage operating mode S1 first executes an intermediate operation S16. In the intermediate operation S16, the allocated part of the resources of the flash memory controller 100 is deallocated. The deallocating of the allocated resources may include an erasing of the diagnostic messages previously stored thereat.

Figure 4:
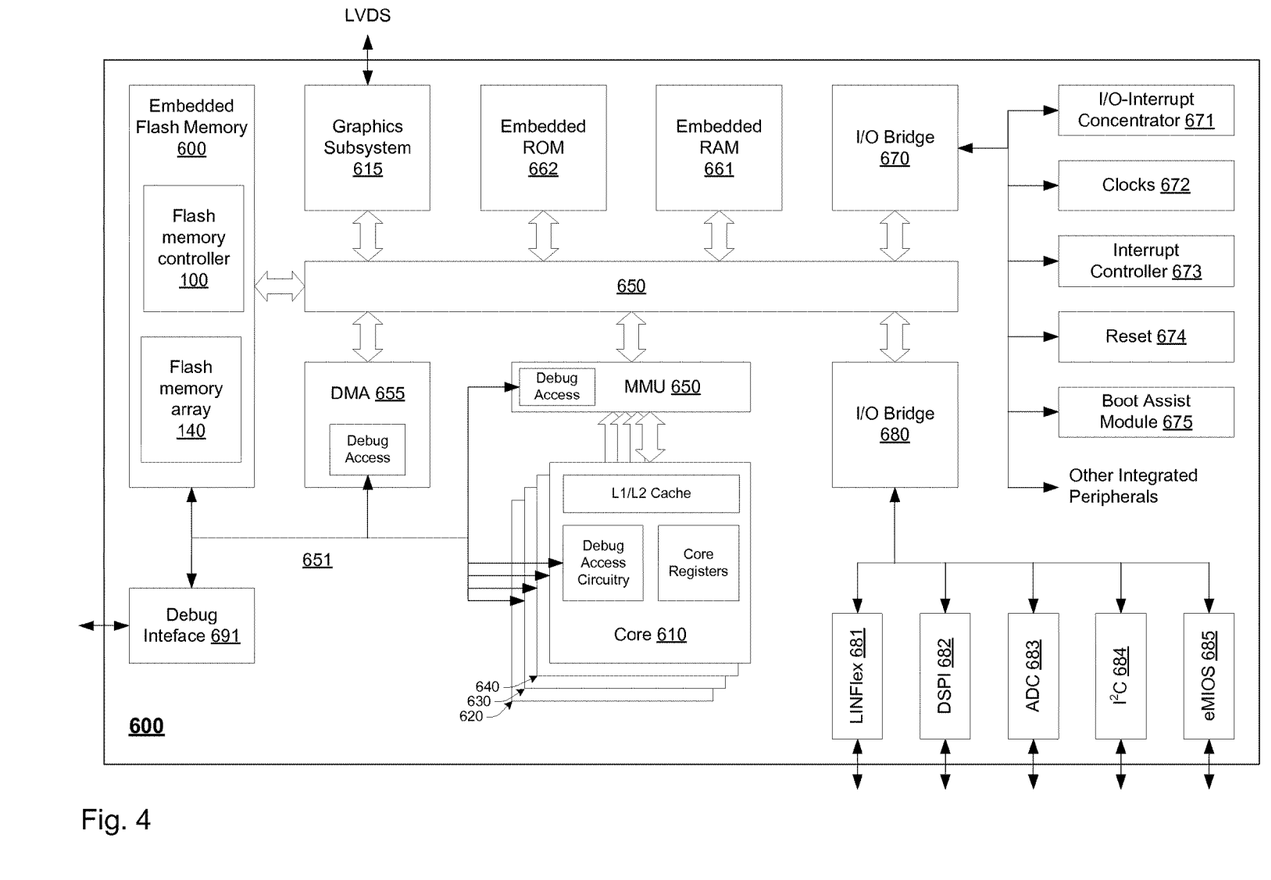
FIG. 4 schematically illustrates a block diagram of a data processing system according to an example of the present invention.

Referring now to FIG. 4, a simplified block diagram of a data processing system comprising a flash memory controller according to an example of the present application schematically illustrated. Those skilled in the art will understand from the following description that the data processing system schematically illustrated in FIG. 4 has been simplified to facilitate a basic understanding of the features of the data processing system and is for purposes of illustration only.

The data processing system shown in FIG. 4 illustrates a multi-core system on chip 600 having multiple processor cores 610, 620, 630, 640, memories 661, 662, 100 and I/O components 615, 681 to 685 and further integrated peripherals interconnected to each other via a system bus 650 to form a data processing system.

The multi-core system on chip 600 should be understood as one example of a data processing system or a data processing device in the context of the present application. As illustrated, each of the processor cores 610, 620, 630, 640 is coupled to one or more levels of cache memories, such as an L1 instruction cache (I-Cache), L1 data cache (D-Cache), and/or L2 cache. While the processor cores 610, 620, 630, 640 may be identically designed or homogenous, the multi-core SoC may also include one or more cores with different design(s). For example, the depicted multi-core SoC 600 may also include one or more accelerators (not shown) with one or more processor cores for supporting hardware accelerated, dedicated data processing functionalities such as DFT (Discrete Fourier Transformation)/iDFT (inverse Discrete Fourier Transformation) and FFT (Fast Fourier Transformation)/iFFT (inverse Fast Fourier Transformation) and CRC (Cyclic Redundancy Check) processing to enumerate only an exemplary, non-limiting number of hardware accelerators.

Each processor core 610 to 640 is coupled across a system bus 650, which interconnects the components of data processing system 600 and interfaces data and instruction communication between the processor core 610 to 640 and the further components of the data processing system 600. The system bus 650 may be a coherency fabric, a switch fabric or a crossbar switch. The system bus 650 manages the data/instruction flow between the processor core 610 to 640 and the components of the data processing system 600. The system bus 650 may be configured to concurrently accommodate a large number of independent accesses that are processed on each clock cycle, and enables for instance communication data/instruction requests from the processor cores 610 to 640 to on-chip storage(s), as well as data/instruction responses therefrom. In selected examples, the system bus 650 may include logic (such as multiplexers or a switch fabric, for example) that allows any processor core to access any bank of memory, and that conversely allows data to be returned from any memory bank to any core. The system bus 650 may also include logic to queue data requests and/or responses, such that requests and responses may not block other activity while waiting for service. Additionally, the system bus 650 may be configured as a chip-level arbitration and switching system (CLASS) to arbitrate conflicts that may occur when multiple cores attempt to access a memory or vice versa.

Each of the processor cores 610, 620, 630, 640 may be configured to execute instructions and to process data according to a particular instruction set architecture (ISA).

Those of ordinary skill in the art also understand the present invention is not limited to any particular manufacturers microprocessor design. The processor core may be found in many forms including, for example, any 32-bit or 64-bit microprocessor. However, any other suitable single or multiple microprocessors, microcontrollers, or microcomputers may be utilized. In the illustrated example, each processor core 610, 620, 630, 640 may be configured to operate independently of the others, such that all processor cores may execute in parallel. In some examples, each of processor cores may be configured to execute multiple threads concurrently, where a given thread may include a set of instructions that may execute independently of instructions from another thread. Such a processor core may also be referred to as a multithreaded (MT) core. Thus, a single multi-core SoC 600 with four cores will be capable of executing a multiple of four threads in this configuration. However, it should be appreciated that the invention is not limited to four processor cores and that more or fewer cores can be included. In addition, the term "processor core" or "core" refers to any combination of hardware, software, and firmware typically configured to provide a processing functionality with respect to information obtained from or provided to associated circuitry and/or modules (e.g., one or more peripherals, as described below). Such cores include, for example, digital signal processors (DSPs), central processing units (CPUs), microprocessors, and the like. These cores are often also referred to as masters, in that they often act as a bus master with respect to any associated peripherals. Furthermore, the term multi-core (or multi-master) refers to any combination of hardware, software, and firmware that includes two or more such cores (e.g., cores 610 and 620), regardless of whether the individual cores are fabricated monolithically (i.e., on the same chip) or separately. Thus, a second core may be the same physical core as first core, but has multiple modes of operation (i.e., a core may be virtualized).

As depicted, each processor core (e.g., 610) may include a first level (L1) cache, which includes a data cache (D-Cache) and an instruction cache (I-Cache). In addition, a second level of cache memory (L2) may also be provided at each core, though the L2 cache memory can also be an external L2 cache memory, which is shared by one or more processor cores. The processor core 610 executes instructions and processes data under control of the operating system (OS) which may designate or select the one processor core as the control or master node for controlling the workload distribution or may be distributed among two or more of the processor cores 610 to 640.

The data processing system 600 may comprise a memory management unit (MMU) 650, which is configured to translate between one or more virtual address spaces and physical address space. The memory management unit (MMU) 650 may be further arranged to provide memory protection mechanisms, cache control and/or cache coherency protocols and/or bus arbitration.

The system bus 650 may further couple the members of the system bus 650 to a Direct Memory Access (DMA) controller 642 to facilitate the communication over the system bus 650 and offload the processor cores 610 to 640.

The data processing system 600 may further comprise a dedicated graphics sub-system 615. The graphics sub-system 615 may be configured to manage the transfer of data between the processor cores 610, 620, 630, 640 and graphics sub-system 615, for example, through the system bus 650. The graphics sub-system 615 may include one or more processing cores for supporting hardware accelerated graphics generation. The graphics generated by the graphics sub-system 615 may be outputted to one or more displays via any display signaling interface such as LVDS, HDMI, DVI and the like.

The system bus 650 is in communication with one or more memory controllers to provide access to the internal or embedded memory storages. In an example, the data processing system 600 comprises an embedded ROM (read only memory) 662, an embedded RAM (random access memory) 661 and the flash memory 600. Each memory storage component is provided with an interface circuitry arranged to allow read and/or write access to the different types of memories via the system bus 650. Interface circuitries comprise controllers, which may be configured to manage the transfer of data/instructions between the processor cores 610, 620, 630, 640 and respective memory storage, for example. In some embodiments, multiple instances of memory controller may be implemented, with each instance configured to control a respective bank of memory. The embedded RAM (random access memory) 661 may be any suitable type of random access memory technology e.g. Double Data Rate or Double Data Rate 2 or Double Data Rate 3 Synchronous Dynamic Random Access Memory (DDR/DDR2/DDR3 SDRAM), or Rambus DRAM (RDRAM). The flash memory 600 may be any type of flash memory based storage technology such as NOR technology flash or NAND Flash memory implemented on the basis of single-level cells (SLC), each of which stores only one bit of information, or multi-level cells (MLC), each of which stores several bits of information.

As will be appreciated, the multi-core SoC 600 may be configured to receive data from sources other than system memory. To this end, a network interface engine (not shown) may be configured to provide a central interface for handling Ethernet and SPI interfaces, thus off-loading the tasks from the cores. A storage HUB (not shown) may be configured to interface to one or more external storage (mass) components such as SD (Secure Data), MMC (MultiMediaCard) cards (not shown) and hard disks. In addition, a high-speed serial interface may be configured to support one or more serial RapidIO ports, a PCI-Express Controller, and/or a serial Gigabit Media Independent Interface (SGMII). In addition, one or more hardware-integrated peripherals (IP) may be provided which are configured to couple the cores to external boot and/or service devices.

The one or more hardware-integrated peripherals (IP) may include, without being limited thereto: I/O interrupt concentrators 671, interrupt controller 673, UART (universal asynchronous receiver/transmitter) device(s), clock(s) 672, timer(s), reset circuitry 674, virtual interrupt(s), boot assist module 675, power controller, FlexCAN (enhanced CAN; CAN: Controller Area Network) interface, LinFlex (Serial Communication; LIN: Local interconnect network) interface 681, DSPI (Deserial Serial Peripheral Interface) 682, analogue-to-digital converter (ADC) 683, I$^2$C (Inter-Integrated Circuit) interface 684, an eMIOS (enhanced Modular Input Output System) 685, GPIO (General-purpose input/output) interface ports, and/or other integrated peripheral modules coupled to the system bus 650 through one or more I/O bridges 670, 680.

Instructions for the operating system, applications, and/or programs may be provided in one or more storages or memories, which are in communication with processor cores 610 to 640 through the system bus 650. In illustrative examples, the instructions are in a functional form on a non-transitory tangible medium such as a persistent mass storage. These instructions may be loaded into memory for running by processor cores 610 to 640. The processes of the different examples may be performed by processor cores 610 to 640 using computer-implemented instructions, which may be in a storage or memory. These instructions are referred to as program code, computer usable program code, or computer readable program code that may be read and run by one or more processor cores 610 to 640 in the data processing system 600. The program code in the different examples may be embodied on different physical or computer readable non-transitory tangible storage media.

Program code may be in a functional form on computer readable medium that may be selectively removable and may be loaded onto or transferred to the data processing device for running by the one or more processor cores. Program code and computer readable medium form a computer program product in these examples. In one example, computer readable medium may be computer readable non-transitory tangible storage medium. Computer readable storage medium may include, for example, an optical or magnetic disk that may be inserted or placed into a drive or other device that may be part of persistent storage for transfer onto a mass storage device, such as a hard drive, that may be part of persistent storage. Computer readable storage medium also may take the form of a persistent storage, such as a hard drive, a thumb drive, or a flash memory, that may be operably coupled to data processing device. In some instances, computer readable storage medium may not be removable from data processing device.

The data processing system 600 is further provided with debug functionality, which is provided by the flash memory controller 100 of the flash memory 600. Data processing system 600 has a debug interface 691 for an external debugger, which is user programmable and implements programmed operations designed to observe and analyze the data processing system 600. The external debugger can insert memory operations or transactions into registers of a processor core via communications through the debug interface 691. The processor cores 610 to 640 may be placed into a special mode of operation to permit the external debugger to directly perform debug command operations thereon.

The flash memory controller 100 with debug functionality of FIG. 4 interfaces with each of processor core 610 to 640, the cache memories L1 and/or L2 or the cache manager (not shown) thereof, the system memory such as embedded RAM 661 and/or embedded flash memory 660, the memory management unit (MMU) 650, the direct memory access (DMA) 655 and further component coupled to the system bus 650 and acting as bus master. The flash memory controller 100 is further in communication with the debuggable components over a separate debug bus 651 or point-to-point connections. Alternatively and/or additionally, debug related information may be communicated between the flash memory controller 100 with debug functionality and the debuggable components over the system bus 650.

The flash memory controller 100 with debug functionality may interface to external debugger through a separate communication connection to the debug interface 691. The debug interface 691 may be part of the flash memory controller 100 with debug functionality. Such an external debugger is typically implemented as circuitry that is off-chip or external to a semiconductor die. However, in some embodiments, a portion of the external debugger may be implemented on-chip or on the same semiconductor die. The external debugger is coupled to test or debug terminals provided by the debug interface 691 interfacing with the flash memory controller 100 with debug functionality. The flash memory controller 100 with debug functionality may have additional test or debug terminals coupled to test terminals of the processor cores 610 to 640, the cache memories L1 and/or L2 or the cache manager (not shown) thereof, the system memory such as embedded RAM 661 and/or embedded NV-Memory 660, the memory management unit (MMU) 650, the direct memory access (DMA) 655, and further bus master components.

The flash memory controller 100 with debug functionality is further arranged to provide real time trace monitor functionality including monitoring and/or tracing processing activity as seen on the interconnect bus 650 and at the processor cores 610 to 640, as well as monitoring other events within data processing system 600, such as events within the various components of data processing system 600 by other interfaces (not shown) and provides information useful for analyzing the operation of data processing system 600. The flash memory controller 100 with debug functionality comprises a trace memory for buffering trace information generated in response to the monitoring and/or tracing operations.

The debuggable components such as the processor cores 610 to 640, the embedded RAM 661 and/or embedded NV-Memory 660, the memory management unit (MMU) 650, the direct memory access (DMA) 655 may comprise specific debug access circuitries interfacing with the debug bus 651 allowing the flash memory controller 100 with debug functionality to monitor, retrieve and/or write internal address and data information, register information, and state information for registering events and/or for generating trace information.

In other examples, other types of data processing systems may include different configurations and/or have additional circuitry. Also, other examples may not have all of the circuitry shown in FIG. 4. In one example, some or all of the circuitry shown in FIG. 4 may be implemented on one integrated circuit. However, in other examples, the data processing system 600 may be implemented with multiple integrated circuits. In one example, the data processing system 600 may be implemented as part of an information system such as e.g. a computer, cell phone, PDA, electronic control circuitry of an automobile, or other type of system implementing a data processing system.

According to an example of the present application, a flash memory controller 100 is provided, which comprises storage resources 130, 136, a system bus interface 105, a debug bus interface 125, a flash access control block 115 and a debug control block comprising a trace control block 123. The system bus interface 105 is provided to interface data communication between the flash memory controller 100 and a system bus 650 of a data processing system 600 in particular to receive data access requests. The debug bus interface 125 is provided to interface data communication between the flash memory controller 100 and a debug bus 651 of the data processing system 600. The flash access control block 115 is provided to receive the data access requests via the system bus interface 105 and to perform storage I/O operations on a flash memory array 140 in response to the received data access requests. The trace control block 123 is provided to monitor debug related information via the debug bus interface 125. The flash memory controller 100 is configured to selectively operate in one of storage operating mode S1 and debug operating mode S10. In the debug operating mode S10: the storage control block 115 is configured to serve only read data access requests received via the system bus interface 105; and the debug control block is configured to store trace messages in an allocated part of the storage resources 130 in response to trace events. The trace messages are generated on the basis of the monitored debug related information collected by the trace control block 123.

According to an example of the present application, the flash memory controller 100 further comprises an allocation/deallocation block 160, which is configured to allocate at least a part of the storage resources available in the flash memory controller 100 on transitioning to the debug operating mode S10 for storing the trace messages.

According to an example of the present application, the storage resources further includes one or more registers 136 of the flash memory controller 100. The allocation/deallocation block 160 is further configured to reconfigure at least a part of registers 136 on allocating at least a part of the storage resources. The trace control block 123 is further configured to use the reconfigured registers as trace control and status register on allocating at least a part of the storage resources According to an example of the present application, the flash memory controller 100 is further configured to selectively operate in halt operating mode S12. On occurrence of a breakpoint signaled to the flash memory controller 100, the flash memory controller 100 is configured to transition to the halt operating mode S12. In the halt operating mode S12: the trace control block 123 is configured to serve trace message retrieval requests received from an external debugger.

According to an example of the present application, the debug related information comprises data, instruction and address information. The trace control block 123 is further configured to snoop the data, instruction and addresses on an internal processor core bus through the debug bus interface 125 and the debug bus 651 of the data processing system 600.

According to an example of the present application, the trace control block is further configured to perform one of starting and stopping one or more of a data trace, an ownership trace, a program trace and a watchpoint trace.

According to an example of the present application, the trace control block is further configured to perform monitoring related to at least one of a trace of a processor, bus and peripheral According to an example of the present application, in the debug operating mode S10: the storage control block 115 is further configured to detect any other data access requests such as write data access requests and to control a transition of the flash memory controller 100 to the storage operating mode S1 in response to detection of a data access request, which cannot be served by the flash memory controller 100 operating in the debug operating mode S10.

According to an example of the present application, the flash memory controller 100 further comprises a diagnostic control block 150, which is configured to retrieve and store diagnostic information. The flash memory controller 100 is further configured to selectively operate in diagnostic operating mode S20.

In the diagnostic operating mode S20, the storage control block 115 is configured to serve only read data access requests received via the system bus interface 105 and the diagnostic control block 150 is configured to store diagnostic messages in an allocated part of the storage resources in response to diagnostic events. The diagnostic messages are generated on the basis of the retrieved diagnostic information collected by the diagnostic control block 150.

According to an example of the present application, the allocation/deallocation block 160 is further configured to allocate at least a part of the storage resources on transitioning to the diagnostic operating mode S20.

According to an example of the present application, the flash memory controller 100 is further configured to selectively operate in capture operating mode S22. On occurrence of a system failure signaled to the flash memory controller 100, the flash memory controller 100 is configured to transition to the capture operating mode S22. In the capture operating mode S22, the diagnostic control block 150 is configured to program the stored diagnostic messages in the flash memory array 140.

According to an example of the present application, the flash memory controller 100 further comprises a configurable controlling unit 110. One or more of the control blocks such as the flash access control block 115, the trace control block 123 and/or the diagnostic control block 150 are operated under the control of the configurable controlling unit 110.

According to an example of the present application, the flash memory controller 100 further comprises a breakpoint/watchpoint control block 122 and/or a state sequencing control block 123. The breakpoint/watchpoint control block 122 is configured to generate a watchpoint triggering in response to detection of at least one of a program counter value, an address value, an address range, and a data value. The at least one of a program counter value, an address value, an address range, and a data value may be one or more predefined values. The state sequencing control block 123 is configured to generate trigger events in response to a conditional state sequence. In particular, the conditional state sequence comprises one or more conditional states in response a selection of trigger signals, interrupt signals, status information relating to the status of components of the data processing system 100, access indications to special purpose registers, timer signals, counter signals, exception vector signals, data and/or address information. Based on a trigger event trace operations are started or ended.

According to an example of the present application, in the storage operating mode S1 of the flash memory controller 100: the storage control block 115 is configured to serve random data access requests received via the system bus interface According to an example of the present application, an integrated processing system 600 is provided, which comprises at least one processor core 610, . . . , 640; a system bus 650; a debug bus 651; a flash memory array 140 for storing instructions and data; and a flash memory controller 100. The flash memory controller 100 is coupled to the system bus 650 and the debug bus 651 through a system bus interface 105 and a debug bus interface 125. The flash memory controller is a flash memory controller 100 with debug functionality as described above.

According to an example of the present application, the integrated processing system is a system-on-chip 600 or a system-in-package.

According to an example of the present application, a method of operating a flash memory controller 100 is provided. In particular, method of operating a flash memory controller with debug functionality as described above is provided. The flash memory controller 100 is operated selectively in storage operating mode S1 and debug operating mode S10.

In the debug operating mode S10, only read data access requests received via a system bus interface 105 of the flash memory controller 100 are served by a storage control block 115 of the flash memory controller 100. The system bus interface 105 is provided to interface between the flash memory controller 100 and a system bus 650 of a data processing system 600. Debug related information is monitored by a trace control block 123 via a debug bus interface 125 of the flash memory controller 100. The debug bus interface 125 is provided to interface data communication between the flash memory controller 100 and a debug bus 651 of the data processing system 600. Trace messages are generated on the basis of the monitored debug related information collected by the trace control block. The trace messages are stored by the trace control block in an allocated part of storage resources of the flash memory controller 100 in response to trace events.

According to an example of the present application, the flash memory controller 100 is further selectively operated in diagnostic operating mode. In the diagnostic operating mode S20: only read data access requests received via the system bus interface 105 are served by the storage control block 115 of the flash memory controller 100. Further: diagnostic information is retrieved by a diagnostic control block 150 of the flash memory controller 100. Diagnostic messages are generated on the basis of the retrieved diagnostic information collected by the diagnostic control block 150. The diagnostic messages are stored in the allocated part of the storage resources in response to diagnostic events.

According to an example of the present application, the flash memory controller 100 is further selectively operated in capture operating mode S22. The flash memory controller 100 transitions to the capture operating mode S22 on occurrence of a system failure signaled to the flash memory controller 100. In the capture operating mode S22 the stored diagnostic messages is programmed in a flash memory array 140 coupled to the flash memory controller 100 by the diagnostic control block 150.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the disclosure herein may be implemented as electronic hardware, computer software, or combinations of both. To illustrate clearly this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

The invention claimed is:
1. A flash memory controller, comprising:
 a system bus interface arranged to interface data communication between the flash memory controller and a system bus of a data processing system;
 a debug bus interface arranged to interface data communication between the flash memory controller and a debug bus of the data processing system;
 a flash access control block arranged to receive data access requests via the system bus interface and to perform storage I/O, input/output, operations on a flash memory array in response to the received data access requests;
 a debug control block comprising a trace control block and arranged to monitor debug related information via the debug bus interface; and
 storage resources including a random access memory;
 wherein the flash memory controller is configured to selectively operate in one of storage operating mode and debug operating mode;
 in the debug operating mode:
 the flash access control block is configured to serve only read data access requests received via the system bus interface, and
 the trace control block is configured to store trace messages in an allocated part of the storage resources in response to trace events, wherein the trace messages are generated on the basis of the monitored debug related information collected by the trace control block.

2. The flash memory controller according to claim 1, further comprising:
 an allocation/deallocation block configured to allocate at least a part of the storage resources on transitioning to the debug operating mode.

3. The flash memory controller according to claim 2,
 wherein the storage resources further include registers of the flash memory controller,
 wherein the allocation/deallocation block is further configured to reconfigure at least a part of registers of the flash memory controller on allocating at least a part of the storage resources;
 wherein the trace control block is further configured to use the reconfigured registers as trace control and status registers.

4. The flash memory controller according to claim 3,
 wherein the trace control block is further configured to perform one of starting and stopping one or more of a data trace, an ownership trace, a program trace and a watchpoint trace.

5. The flash memory controller according to claim 1,
 wherein the trace control block is further arranged to deallocate the allocated part of the storage resources on transitioning to the storage operating mode.

6. The flash memory controller according to claim 1,
 wherein the flash memory controller is further configured to selectively operate in halt operating mode;
 wherein on occurrence of a breakpoint signaled to the flash memory controller, the flash memory controller is configured to transition to the halt operating mode;
 in the halt operating mode:
 the trace control block is configured to serve trace message retrieval requests received from an external debugger.

7. The flash memory controller according to claim 1,
 wherein the debug related information comprises data, instruction and address information, wherein the trace control block is further configured to snoop the data, instruction and addresses on an internal processor core bus through the debug bus interface and the debug bus of the data processing system.

8. The flash memory controller according to claim 7, wherein the trace control block is further arranged to perform monitoring related to at least one of a trace of a processor, bus and peripheral.

9. The flash memory controller according to claim 1, in the debug operating mode:
the flash access control block is configured to control a transition of the flash memory controller to the storage operating mode in response to detecting a data access request.

10. The flash memory controller according to claim 1, further comprising
a diagnostic control block configured to retrieve diagnostic information;
wherein the flash memory controller is further configured to selectively operate in diagnostic operating mode;
in the diagnostic operating mode:
the flash access control block is configured to serve only read data access requests received via the system bus interface, and
the diagnostic control block is configured to store diagnostic messages in an allocated part of the storage resources in response to diagnostic events, wherein the diagnostic messages are generated on the basis of the retrieved diagnostic information collected by the diagnostic control block.

11. The flash memory controller according to claim 10, further comprising an allocation/deallocation block configured to allocate at least a part of the storage resources on transitioning to the diagnostic operating mode.

12. The flash memory controller according to claim 10, further comprising
wherein the flash memory controller is further configured to selectively operate in capture operating mode;
wherein on occurrence of a system failure signaled to the flash memory controller, the flash memory controller is configured to transition to the capture operating mode;
in the capture operating mode:
the diagnostic control block is configured to program the stored diagnostic messages in the flash memory array.

13. The flash memory controller according to claim 1, further comprising
a configurable controlling unit configured to operate one or more of the control blocks.

14. The flash memory controller according to claim 1, further comprising at least one of:
a breakpoint/watchpoint control block configured
to generate a watchpoint triggering a trace event in response to detection of at least one of a program counter value, an address value, an address range, and a data value, and
to use reconfigured registers as comparator registers; and
a state sequencing control block configured to generate trigger events in response to a conditional state sequence.

15. The flash memory controller according to claim 1, in the storage operating mode:
the flash access control block is configured to serve random data access requests received via the system bus interface.

16. An integrated processing system, comprising
at least one processor core;
a system bus;
a debug bus;
a flash memory array for storing instructions and data; and
a flash memory controller, coupled to the system bus and the debug bus, including;

a system bus interface arranged to interface data communication between the flash memory controller and the system bus of a data processing system;
a debug bus interface arranged to interface data communication between the flash memory controller and the debug bus of the integrated processing system;
a flash access control block arranged to receive data access requests via the system bus interface and to perform storage I/O, input/output, operations on the flash memory array in response to the received data access requests;
a debug control block comprising a trace control block and arranged to monitor debug related information via the debug bus interface; and
storage resources including a random access memory;
wherein the flash memory controller is configured to selectively operate in one of storage operating mode and debug operating mode;
in the debug operating mode:
the flash access control block is configured to serve only read data access requests received via the system bus interface, and
the trace control block is configured to store trace messages in an allocated part of the storage resources in response to trace events, wherein the trace messages are generated on the basis of the monitored debug related information collected by the trace control block.

17. The integrated processing system according to claim 16,
wherein the integrated processing system is a system-on-chip, SoC, or a system-in-package, SiP.

18. A method of operating a flash memory controller, said method comprising:
selectively operating the flash memory controller in one of storage operating mode and debug operating mode;
in the debug operating mode:
serving read data access requests received via a the system bus interface by a storage control block of the flash memory controller;
monitoring debug related information by a trace control block via a debug bus interface of the flash memory controller,
generating trace messages on the basis of the monitored debug related information collected by the trace control block; and
storing trace messages by a debug control block comprising the trace control block in an allocated part of storage resources of the flash memory controller in response to trace events.

19. The method according to claim 18, further comprising:
selectively operating the flash memory controller in diagnostic operating mode;
in the diagnostic operating mode:
serving only read data access requests received via the system bus interface by a storage control block of the flash memory controller;
retrieving diagnostic information by the diagnostic control block via the system bus interface;
generating diagnostic messages on the basis of the retrieved diagnostic information collected by a diagnostic control block; and
storing the diagnostic messages in the allocated part of the storage resources in response to diagnostic events.

20. The method according to claim 19, further comprising:
- selectively operating the flash memory controller in capture operating mode;
- transitioning to the capture operating mode on occurrence of a system failure signaled to the flash memory controller;
- in the capture operating mode:
- programming the stored diagnostic messages in a flash memory array coupled to the flash memory controller by the diagnostic control block.

\* \* \* \* \*